United States Patent [19]

Duerr et al.

[11] Patent Number: 5,332,990
[45] Date of Patent: Jul. 26, 1994

[54] HIGH-FREQUENCY SAFETY FUSE

[75] Inventors: Wilhelm Duerr; Gerhard Temmel, both of Erlangen, Fed. Rep. of Germany

[73] Assignee: Siemens Aktiengesellschaft, Munich, Fed. Rep. of Germany

[21] Appl. No.: 80,820

[22] Filed: Jun. 24, 1993

[30] Foreign Application Priority Data

Jul. 17, 1992 [DE] Fed. Rep. of Germany ....... 4223621

[51] Int. Cl.$^5$ ............................................. H01H 85/04
[52] U.S. Cl. ...................................... 337/290; 337/295
[58] Field of Search ................ 337/297, 295, 227, 290

[56] References Cited

U.S. PATENT DOCUMENTS

| | | |
|---|---|---|
| 3,875,542 | 4/1975 | Holland et al. ................. 337/297 |
| 5,140,295 | 8/1992 | Vermot-gaud et al. ......... 337/297 |
| 5,155,462 | 10/1992 | Morrill, Jr. ...................... 337/297 |
| 5,166,656 | 11/1992 | Badihi et al. .................... 337/297 |

FOREIGN PATENT DOCUMENTS 0270954 6/1988 European Pat. Off. .

Primary Examiner—Lincoln Donovan
Attorney, Agent, or Firm—Hill, Steadman & Simpson

[57] ABSTRACT

A high-frequency safety fuse has a fusible conductor having a cross-sectional area capable of carrying a high-frequency current, and two electrical terminals respectively connected to opposite ends of the fusible conductor. The cross-sectional area has a dimension in at least one direction which is approximately twice the penetration depth of the high-frequency current in the conductor. A fuse is thereby obtained having a low high-frequency equivalent resistance but also having a low cut-off current.

36 Claims, 3 Drawing Sheets

HIGH-FREQUENCY SAFETY FUSE

BACKGROUND OF THE INVENTION

1. Field of the Invention

The present invention is directed to a high-frequency safety fuse of the type having a fusible conductor with a cross-sectional area capable of carrying a high-frequency current, and having two electrical terminals respectively connected to opposite ends of the fusible conductor.

2. Description of the Prior Art

A safety fuse of the type described above is disclosed in European Application 0 270 954. This known safety fuse is basically suited for protecting high-frequency circuits. A disadvantage in the use of the fuse for protecting such circuits, however, is that a fuse of this type has a relatively high high-frequency equivalent resistance as a consequence of the fuse having a low cut-off current. If a fuse having a low equivalent resistance is required in addition to the requirement of a lower cut-off current, a fusing characteristic which is slow to react must be accepted as a compromise.

Safety fuses used in the megahertz range are used, for example, in the circuit for local coils in a nuclear magnetic resonance tomography apparatus. Local coils are normally employed only for the reception of nuclear magnetic resonance signals. The nuclear spins are excited by means of a transmission pulse transmitted from another antenna, for example a whole-body antenna. The local coil or coils must be decoupled for the duration of the excitation pulse, i.e., the high-frequency magnetic field of the transmission pulse cannot induce any currents in the local coil or coils. This decoupling is usually achieved by an electronic switch having PIN diodes. If this switch malfunctions, extremely high currents, having an effective value up to 10 A, can be induced in the local coil in the extreme case, so that a risk to the patient exists. The cut-off current of the safety fuse used in the local coil circuit must be small enough to preclude risk to the patient.

When safety fuses are used in high-frequency measurement circuits, they must have a low high-frequency equivalent resistance in addition to having a low cut-off current with an effective value on the order of magnitude of a few hundred mA, so that the signal-to-noise ratio is not degraded. In order to meet both demands, fuses which are slow to react must usually be utilized given applications in the megahertz range. Such fuses, however, have a long fusing time of approximately two minutes, given a cut-off current which amounts to twice the nominal current of the fuse.

SUMMARY OF THE INVENTION

It is an object of the present invention to provide a high-frequency fuse of the type having a cross-sectional area which can carry a high-frequency current, having two electrical terminals respectively connected to opposite ends of the fusible conductor, and having a low high-frequency equivalent circuit while still maintaining a low cut-off current.

The above object is achieved in accordance with the principles of the present invention in a high-frequency fuse having a fusible conductor with a cross-sectional area having a dimension in at least one direction which is approximately twice the penetration depth of the nominal high-frequency current in the conductor. The cut-off current is thereby minimized, but a low high-frequency equivalent resistance is presented. This is because if the thickness or the height of the fusible conductor exceeds approximately twice the penetration depth, the high-frequency resistance of the fusible conductor does not become any lower and thus providing the fusible conductor with a dimension which is more than twice the penetration depth of the current does not result in any benefit in lowering the high-frequency equivalent resistance. Providing the fusible conductor with a dimension which is more than twice the penetration depth, however, increases the mass of the fusible conductor, and thus results in a higher melt-through energy being required to sever the conductor, and therefore a higher current results.

In a further embodiment of the invention, the fusible conductor contains two conductor sections, respectively disposed between the ends of the fusible conductor and the electrical terminals, each conductor section having a second cross-sectional area (the initially-identified cross-sectional area being a first cross-sectional area), and the electrical terminals have a third cross-sectional area. The size of the second cross-sectional area is between the respective sizes of the first and third cross-sectional areas. The second cross-sectional area has a dimension in at least one direction (which may be the same or different from the aforementioned direction associated with the fusible conductor) which is approximately twice the penetration depth of the aforementioned nominal high-frequency current. The melt-through energy is thereby further reduced, because the heat dissipation to the environment is maintained at a minimum. Compared to a direct connection of the fusible conductor to the relatively massive electrical terminals, the heat dissipation is considerably reduced by the intervening conductor sections, whereby the cross section of the conductor sections, which is larger in comparison to that of the fusible conductor, assures that only the fusible conductor itself will melt through. The limitation of the second cross-sectional area in the second direction assures that the mass of the conductor section and the cross section of the conductor section, which in combination determine the heat dissipation capability, are not unnecessarily large.

In a further embodiment of the invention, the aforementioned conductor sections are arranged on an electrically and thermally insulating carrier in order to increase the mechanical stability of the fuse.

Because the thermal conductivity of the conductor sections is inversely proportional to the length of the conductor sections, the conductor sections in a further embodiment are made at least as long as the fusible conductor.

In a space-saving embodiment, the conductor sections are arranged in a meandering (serpentine) configuration.

In a further embodiment of the invention, the fusible conductor is essentially composed of aluminum. In addition to its melting properties, aluminum also burns at higher currents, so that a faulty circuit is very quickly disconnected.

In a further embodiment, the fusible conductor is a wire supported in air by the electrical terminals. The thermal energy produced in the fusible conductor is thereby prevented from being dissipated from the conductor due to thermal conduction to the environment, since the air functions as a thermal insulator, to a certain extent.

In order to increase the mechanical strength of the fuse, the fusible conductor is arranged on the aforementioned electrically and thermally insulating carrier in another embodiment of the invention.

The combination of mechanical strength and low heat elimination from the fusible conductor is assured in another embodiment wherein the carrier is formed as a thin layer on a carrier member, the carrier having a recess beneath the fusible conductor.

In another embodiment, the carrier member is composed of a silicon single crystal. Etching processes known from semiconductor technology can be employed for producing the recess.

In a further embodiment, the thin layer of the carrier is composed of silicon oxide or silicon nitride. Both materials are electrical and thermal insulators, and can be applied and worked on the silicon carrier member using methods known from semiconductor technology.

In another embodiment, a plurality of fusible conductors are electrically connected in parallel, the opposite ends of the respective parallel-connected fusible conductors meeting at a common conductor section having the aforementioned second cross-sectional area. The second cross-sectional area each conductor section is larger than the sum of the first cross-sectional areas of the individual fusible conductors connected in parallel. Higher cut-off currents can be achieved with this embodiment.

DESCRIPTION OF THE PREFERRED EMBODIMENTS

All of the embodiments of the high-frequency safety fuse described herein are suitable for use in a nuclear magnetic resonance tomography apparatus for obtaining a tomographic image of a patient, for the purpose of protecting the patient against topically excessive high-frequency loads in the local coil circuits. The safety fuse in such devices must therefore be capable of operating at frequencies from approximately 20 through 80 MHz, and must have a cut-off current of a few hundred mA.

Figure 1:
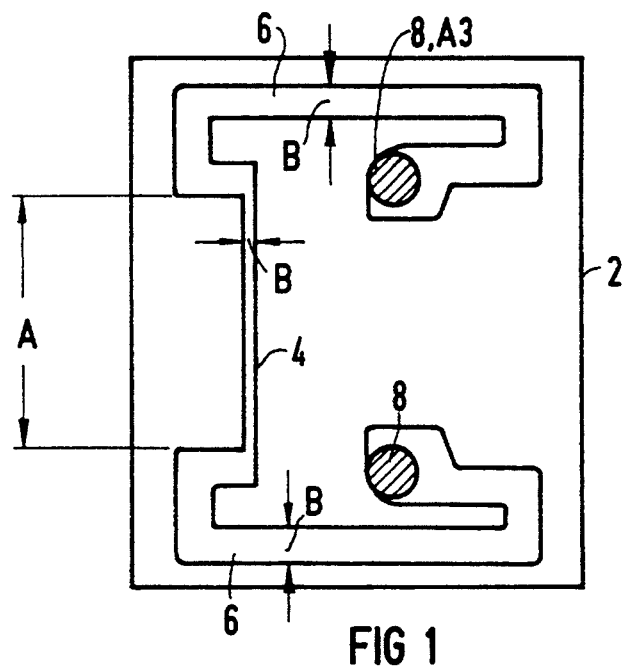
FIG. 1 is a schematic plan view of a high-frequency safety fuse constructed in accordance with the principles of the present invention, with the fusible conductor in the form of a printed conductor run.

In a first embodiment of the invention shown in FIG. 1, a fusible conductor 4 is arranged on a carrier 2 which is approximately 3 mm×4 mm in size, and is composed of an electrically and thermally insulating material such as, for example, a printed circuit board material of epoxy resin or ceramic. The ends of the fusible conductor 4 are respectively connected to electrical terminals 8 via respective conductor sections 6. The fusible conductor 4 and each conductor section 6 is executed as a printed circuit on the carrier 2. The fusible conductor 4 has a first cross section A1 taken through the fusible conductor 4 in a direction substantially perpendicular to the plane of the drawing which is approximately 20 $\mu m \times 20$ $\mu m$. Each conductor section 6 has a second cross section A2, again taken in a plane substantially perpendicular to the plane of the drawing at any location along the length of a conductor section 6, of approximately 20 $\mu m \times 100$ $\mu m$. The second cross section A2 is thus five times the size of the first cross section A1.

Figure 4:
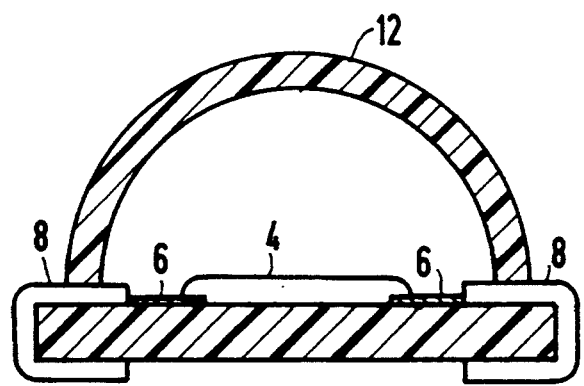
FIG. 4 is a side sectional view of an embodiment of a high-frequency safety fuse constructed in accordance with the principles of the present invention in the form of a surface mountable device (SMD).

The electrical terminals 8 are in the form of solid terminal wires arranged perpendicularly on the carrier 2, and thus perpendicular to the plane of the drawing in FIG. 1. The electrical terminals 8 each have a third cross-sectional area A3 which is a multiple of the area of the second cross section A2, since the mechanical fastening and electrical connection of the high-frequency safety fuse simultaneously ensue via the electrical terminals 8. In order to maintain the high-frequency cut-off current low, the mass of the fusible conductor 4 and of the conductor sections 6 is minimized. To achieve this, as best shown in FIG. 4, the cross section A1 of the fusible conductor 4 has a dimension in at least one direction, such as the dimension D1, and the cross section A2 has a dimension in at least one direction, such as the dimension D2, which is twice the penetration depth of the nominal high-frequency current carried by the fuse. The dimensions D1 and D2 in one direction of the respective cross-sectional areas, i.e., the uniform thickness of the fusible conductor 4 and of the conductor sections 6, are approximately 20 $\mu m$, so that the operating frequency of the high-frequency safety fuse is approximately 50 MHz.

The conductor sections 6 have a minimum length in order to avoid problematical heat elimination to the relatively massive electrical terminals 8. Moreover, the width B (FIG. 1) of the conductor sections 6 is preferably as narrow as possible in order to maintain heat elimination to the carrier 2 at a low level. A limitation on the width B of the conductor sections 6, however, is that the conductor sections 6 should contribute as little as possible to the high-frequency resistance.

The electrical strength of the high-frequency safety fuse is defined by the spacing A between the ends of the fusible conductor 4. For an electric strength of, for example, 1000 V, a spacing A of approximately 2 mm is adequate.

Encapsulation in, for example, a plastic housing for small semiconductors has proven to be a useful format for the high-frequency safety fuse of the invention. The air volume contained within the encapsulation prevents heat elimination from the fusible conductor 4 which might otherwise arise from convection in a larger space.

Figure 2:
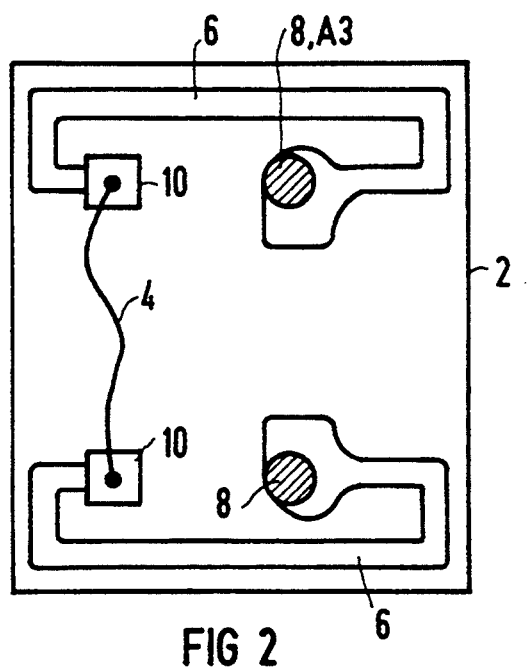
FIG. 2 is a schematic plan view of a high-frequency safety fuse constructed in accordance with the principles of the present invention, with the fusible conductor in the form of wire extending through air.

In the embodiment of FIG. 2, the fusible conductor 4 is composed of a thin wire extending through air. A compromise between the melting point and the high-frequency resistance must be made when selecting the material for the fusible conductor 4. Conductor materials such as aluminum, gold or copper have a resistance of 50 through 80 mΩ per mm of length, given a wire diameter of 20 μm. At this wire diameter, the cut-off current is approximately 0.5 A. If the fusible conductor 4 is mainly composed of aluminum, an especially fast disconnection of the faulty circuit is achieved, because the fusible conductor 4 not only melts but also burns at the same time. That end of the conductor sections 6 lying opposite the electrical terminal is implemented as a bonding surface (pad) 10 in the embodiment of FIG. 2, to which the fusible conductor 4 is connected to the conductor sections 6 via a bond connection of a known type. This structure has the advantage that no direct heat elimination from the fusible conductor 4 to the carrier 2 occurs.

Fuses having a cut-off current of a few hundred mA given a high-frequency resistance of approximately 200 through 300 mΩ can be achieved with this structure.

As noted above, the optimum thickness of the fusible conductor 4 is established by the penetration depth of the current conducted by the fusible conductor 4. When high-frequency safety fuses having higher cut-off currents are desired, a parallel connection of a plurality of fusible conductors 4 is preferable, instead of simply enlarging the conductor diameter of a single fusible conductor. This applies both to the embodiments of FIGS. 1 and 2.

Figure 3:
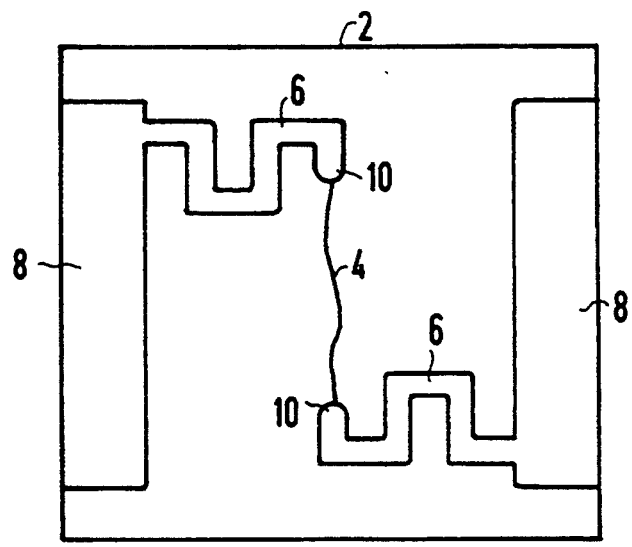
FIG. 3 is a schematic plan view of a high-frequency safety fuse constructed in accordance with the principles of the present invention having rectangularly serpentine conductor sections, with the fusible conductor being a wire extending through air.

A compact structure of a high-frequency safety fuse is shown in FIG. 3, wherein the relatively long conductor sections 6 are arranged in a meandering, rectangularly serpentine pattern on the carrier 2. As in the embodiment of FIG. 2, the fusible conductor 4 is in the form of an aluminum wire extending through air. The embodiment of the safety fuse of FIG. 3 is shown in FIG. 4 contained in a housing as a surface-mountable device (SMD). To that end, a copper coating is conducted from the electrical terminals 8 over the sides of the carrier 2 to the underside thereof. The high-frequency safety fuse can thus be directly placed on, and soldered to, a printed circuit board. An encapsulation 12 prevents mechanical damage and heat elimination due to convection.

Figure 5:
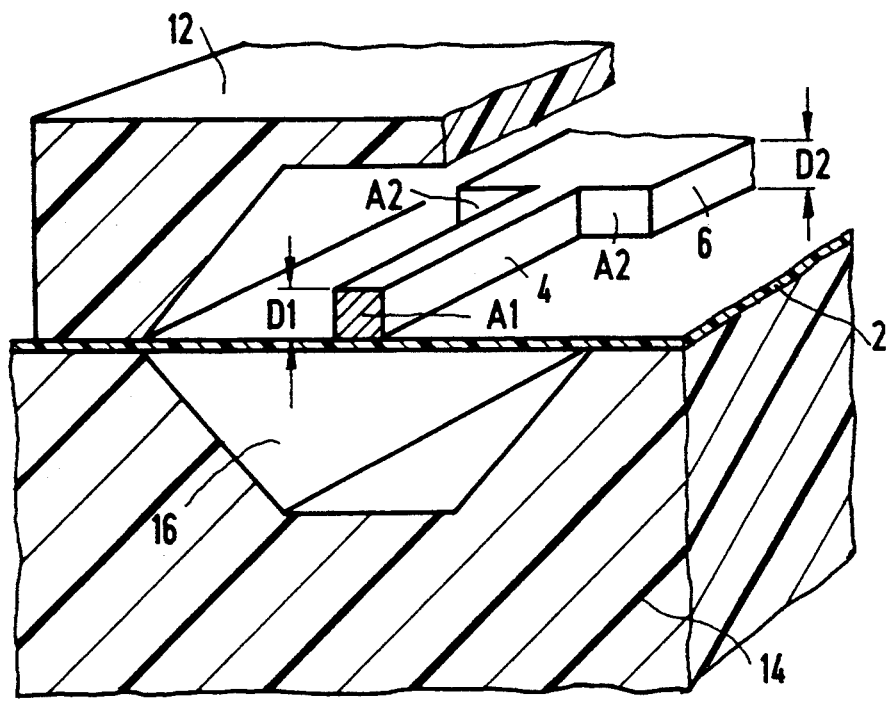
FIG. 5 is a schematic perspective view, partly in section, of a high-frequency safety fuse constructed in accordance with the principles of the present invention with the fusible conductor arranged on a thin carrier layer which is electrically and thermally non-conductive.

A format for a high-frequency safety fuse which can be manufactured using methods known from semiconductor technology, particularly etching methods, is shown in FIG. 5. In this embodiment, a layer of silicon nitride or silicon oxide having a thickness of a few μm is applied as a carrier 2 on a carrier member 14 composed of a silicon single crystal oriented in the crystal (plane) direction (100). Both the fusible conductor 4 and the conductor sections 6 are arranged on the carrier 2 in the form of printed conductor runs. A trapezoidal recess 16 is generated beneath the fusible conductor 4 by under-etching in the crystal direction (111). The fusible conductor 4 is substantially self-supporting over a length of approximately 2 mm, and is thus only in contact with the remaining oxide or nitride layer, which is a few μm thick. The advantages of the embodiments of FIGS. 1 and 2 are thus united in the embodiment of FIG. 5. First, the heat elimination from the fusible conductor 4 is extremely low because of the very thin, layer-like fashioning of the carrier 2 and second, the structure of the fusible conductor 4 and the conductor section 6 can be simply manufactured using an etching technique. In order to avoid air convection, an encapsulation 12 of silicon oxide or plastic can be directly applied over the printed structure. The recess 16 may alternatively be V-shaped.

During manufacture, the silicon nitride layer, for example, is first applied on the silicon single crystal. Subsequently, a conductive layer having the desired thickness is vapor-deposited onto the silicon nitride layer. Subsequently, the structure is etched.

Figure 6:
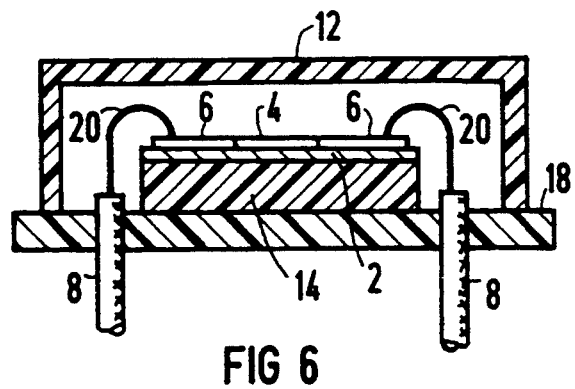
FIG. 6 is a side sectional view of an encapsulated high-frequency safety fuse constructed in accordance with the principles of the present invention.

A further embodiment is shown in FIG. 6 which illustrates how the high-frequency safety fuse can be provided with a housing and contacted with the electrical terminals 8. In terms of structure, the safety fuse of FIG. 6 corresponds to the that in the embodiment of FIG. 5, except for the arrangement of the encapsulation 12. The carrying member 14 having the silicon nitride layer and the conductor runs forming the fusible conductor 4 and the conductor sections 6 is arranged on a board 18, on which the electrical terminals 8 are secured in the form of terminal wires. The respective electrical connections of the conductor sections 2 to the electrical terminal wires 8 ensues via a bond wire 20.

Although modifications and changes may be suggested by those skilled in the art, it is the intention of the inventors to embody within the patent warranted hereon all changes and modifications as reasonably and properly come within the scope of their contribution to the art.

We claim as our invention:

1. A high-frequency safety fuse comprising:
   a fusible conductor having a cross-sectional area for carrying a high-frequency current, said current having a frequency giving said current a penetration depth in said fusible conductor, said conductor having a dimension in at least one direction which is substantially twice said penetration depth of said high-frequency current, said fusible conductor having opposite ends; and
   two electrical terminals respectively connected to said opposite ends of said fusible conductor.

2. A high-frequency safety fuse as claimed in claim 1 wherein said cross-sectional area is defined as a first cross-sectional area, wherein said electrical terminals each have a third cross-sectional area, and said safety fuse further comprising:
   respective conductor sections disposed between said opposite ends of said fusible conductor and said electrical terminals;
   each of said conductor sections having a second cross-sectional area having a size between the respective sizes of said first and third cross-sectional areas; and
   said each of conductor sections having a dimension in at least one direction which is approximately twice said penetration depth of said high-frequency current.

3. A high-frequency safety fuse as claimed in claim 2 further comprising an electrically and thermally insulating carrier on which said conductor sections are disposed.

4. A high-frequency safety fuse as claimed in claim 3 wherein said fusible conductor is also disposed on said electrically and thermally insulating carrier.

5. A high-frequency safety fuse as claimed in claim 4 further comprising a carrier member on which said carrier is disposed, said carrier being in the form of a thin layer on said carrier member, and wherein said carrier member has a recess therein disposed beneath said fusible conductor.

6. A high-frequency safety fuse as claimed in claim 5 wherein said carrier member comprises a silicon single crystal.

7. A high-frequency safety fuse as claimed in claim 5 wherein said thin layer forming said carrier consists of silicon oxide.

8. A high-frequency safety fuse as claimed in claim 5 wherein said thin layer forming said carrier consists of silicon nitride.

9. A high-frequency safety fuse as claimed in claim 2 wherein said conductor sections have a length at least as long as said fusible conductor.

10. A high-frequency safety fuse as claimed in claim 2 wherein said conductor sections have a rectangularly serpentine shape.

11. A high-frequency safety fuse as claimed in claim 1 wherein said fusible conductor is essentially composed of aluminum.

12. A high-frequency safety fuse as claimed in claim 1 wherein said fusible conductor comprises a wire extending through air between said electrical terminals.

13. A high-frequency safety fuse as claimed in claim 2 comprising a plurality of fusible conductors electrically connected in parallel between said conductor sections, each of said fusible conductors having a first cross section, and said second cross section of said conductor sections being larger than the sum of said first cross sections of said fusible conductors connected in parallel.

14. A high-frequency safety fuse as claimed in claim 1 comprising a plurality of said fusible conductors electrically connected in parallel between said electrical terminals.

15. A high-frequency safety fuse comprising:
a carrier member;
a thermally and electrically insulating thin layer disposed on said carrier member;
a fusible conductor in the form of a printed conductor run on said thin layer for carrying a high-frequency current, said current having a frequency giving said current a penetration depth in said fusible conductor, said fusible conductor having a cross-sectional area with a dimension in at least one direction which is substantially twice said penetration depth of said high-frequency current in said fusible conductor, said fusible conductor having opposite ends; and
two electrical terminals respectively electrically connected to said opposite ends of said fusible conductor.

16. A high-frequency safety fuse as claimed in claim 15 wherein said cross-sectional area is defined as a first cross-sectional area, wherein said electrical terminals have a third cross-sectional area, and further comprising:
respective conductor sections in the form of conductor runs on said thin layer disposed between said ends of said fusible conductor and said electrical terminals, each conductor section having a second cross-sectional area;
said second cross-sectional area having a size between the respective sizes of said first and third cross-sectional areas; and
said each of conductor sections having a dimension in at least one direction which is substantially twice said penetration depth of said high-frequency current.

17. A high-frequency safety fuse as claimed in claim 16 further comprising bonding wires respectively extending between said conductor sections and said electrical terminals.

18. A high-frequency safety fuse as claimed in claim 15 wherein said carrier member has a recess therein extending under said fusible conductor.

19. A high-frequency safety fuse as claimed in claim 15 further comprising an encapsulation covering said fusible conductor on said thin layer.

20. A high-frequency safety fuse as claimed in claim 15 wherein said carrier member is composed of a silicon single crystal.

21. A high-frequency safety fuse as claimed in claim 15 wherein said thin layer consists of a material selected from the group consisting of silicon oxide and silicon nitride.

22. A high-frequency safety fuse as claimed in claim 1 wherein said fusible conductor comprises a fusible conductor having a cross-sectional area for carrying a high-frequency current in a range of approximately 20 through 80 MHz.

23. A high-frequency safety fuse as claimed in claim 15 wherein said fusible conductor comprises a fusible conductor having a cross-sectional area for carrying a high-frequency current in a range of approximately 20 through 80 MHz.

24. A method for manufacturing a high-frequency safety fuse comprising the steps of:
providing a fusible conductor with a cross-sectional area for carrying a high-frequency current, said current having a frequency giving said current a penetration depth in said conductor, said fusible conductor having opposite ends;
ensuring said fusible conductor has a dimension in at least one direction which is substantially twice said penetration depth of said high-frequency current; and
connecting two electrical terminals respectively to said opposite ends of said fusible conductor.

25. A method as claimed in claim 24 wherein said cross-sectional area is defined as a first cross-sectional area, wherein said electrical terminals each have a third cross-sectional area, and comprising the additional steps of:
disposing respective conductor sections between said opposite ends of said fusible conductor and said electrical terminals;
providing each of said conductor sections with a second cross-sectional area having a size between the respective sizes of said first and third cross-sectional areas; and
ensuring that said conductor sections have a dimension in at least one direction which is approximately twice said penetration depth of said high-frequency current.

26. A method as claimed in claim 25 comprising the additional step of:
disposing said conductor sections on an electrically and thermally insulating carrier.

27. A method as claimed in claim 26 comprising the additional step of:
also disposing said fusible conductor on said electrically and thermally insulating carrier.

28. A method as claimed in claim 27 comprising the additional steps of:
disposing said carrier on a carrier member in the form of a thin layer on said carrier member; and
providing a recess in said carrier member disposed beneath said fusible conductor.

29. A method as claimed in claim 28 wherein the step of disposing said carrier on a carrier member in the form of a thin film layer on said carrier member is further defined by disposing said carrier on a carrier member comprising a silicon single crystal in the form of a thin film layer on said silicon single crystal.

30. A method as claimed in claim 28 wherein the step of disposing said carrier on a carrier member in the form of a thin layer on said carrier member is further defined by disposing said carrier on said carrier member in the form of a thin layer consisting of silicon oxide.

31. A method as claimed in claim 28 wherein the step of disposing said carrier on a carrier member in the form of a thin layer on said carrier member is further defined by disposing said carrier on said carrier member in the form of a thin layer consisting of silicon nitride.

32. A method as claimed in claim 25 comprising the additional step of:
    making each of said conductor sections and said fusible conductor of equal length.

33. A method as claimed in claim 25 comprising the additional step of:
    forming said conductor sections in a rectangularly serpentine path between said opposite ends of said fusible conductor and said electrical terminals.

34. A method as claimed in claim 24 wherein the step of providing a fusible conductor is further defined by providing a fusible conductor essentially composed of aluminum.

35. A method as claimed in claim 24 wherein the step of providing a fusible conductor is further defined by providing a fusible conductor comprising a wire extending through air between said electrical terminals.

36. A method as claimed in claim 25 comprising the additional step of:
    providing a plurality of said fusible conductors electrically connected in parallel between said conductor sections, each of said fusible conductors having a first cross section; and
    providing said conductor sections with a second cross section which is larger than the sum of said first cross sections of said fusible conductors connected in parallel.

* * * * *

UNITED STATES PATENT AND TRADEMARK OFFICE
CERTIFICATE OF CORRECTION

PATENT NO.   : 5,332,990
DATED        : July 26, 1994
INVENTOR(S)  : Wilhelm Duerr et al.

It is certified that error appears in the above-indentified patent and that said Letters Patent is hereby corrected as shown below:

Title page, item [73],
Change the Assignee to read:

Siemens Aktiengesellschaft, Munich and
    Fraunhofer-Gesellschaft fuer die Foerderung
    der Angewandten Forschung E.V., Munich,
    Fed. Rep. of Germany Signed and Sealed this Twenty-sixth Day of September, 1995

*Attest:*

BRUCE LEHMAN

*Attesting Officer*      *Commissioner of Patents and Trademarks*